United States Patent [19]

Igari et al.

[11] Patent Number: 5,065,047

[45] Date of Patent: Nov. 12, 1991

[54] DIGITAL CIRCUIT INCLUDING FAIL-SAFE CIRCUIT

[75] Inventors: Yuichi Igari, Yokosuka; Masahiro Ishikawa, Yokohama; Mitsuo Kaneko, Yokosuka, all of Japan

[73] Assignee: Nissan Motor Co., Ltd., Yokohama, Japan

[21] Appl. No.: 499,590

[22] Filed: Mar. 27, 1990

[30] Foreign Application Priority Data

Mar. 27, 1989 [JP] Japan .................. 1-71832
Mar. 29, 1989 [JP] Japan .................. 1-74989

[51] Int. Cl.⁵ ........................................... H03K 19/007
[52] U.S. Cl. ................................... 307/442; 307/296.4
[58] Field of Search ............... 307/296.4, 442, 360, 307/480, 519, 524, 494

[56] References Cited

U.S. PATENT DOCUMENTS

| | | | |
|---|---|---|---|
| 4,446,437 | 5/1984 | Rinaldi | 307/442 |
| 4,539,523 | 9/1985 | Rosso | 307/519 |
| 4,627,085 | 12/1986 | Yuen | 307/480 |
| 4,667,184 | 5/1987 | Futsuhara | 307/442 |
| 4,859,872 | 8/1989 | Hyakutake | 307/494 |
| 4,900,951 | 2/1990 | Saito et al. | 307/296.4 |
| 4,914,316 | 8/1990 | Rossi et al. | 307/296.4 |

*Primary Examiner*—David Hudspeth
*Assistant Examiner*—Andrew Sanders
*Attorney, Agent, or Firm*—Foley & Lardner

[57] ABSTRACT

A digital circuit including a processor operated in synchronization with a clock signal to output a control signal to be fed to an actuator, in which a converter converts a period of frequency of the clock signal to an analog voltage value, and a comparator compares whether or not the analog voltage value is within a reference value range to output a comparison signal, and in which a holding device allows the control signal to pass or stop to the actuator on the basis of the comparison signal.

20 Claims, 10 Drawing Sheets

DIGITAL CIRCUIT INCLUDING FAIL-SAFE CIRCUIT

BACKGROUND OF THE INVENTION

1. Field of the Invention

The present invention relates to a digital circuit for use in a circuit for producing a drive signal for an actuator or the like, and in particular to a digital circuit including a fail-safe circuit for forcibly and automatically holding an output of the digital circuit to a fail-safe side when a problem or anything unusual such as a stop or a frequency change of a system clock signal happens.

2. Description of the Background Art

In a conventional digital circuit, as shown in FIG. 1, processors $PC_1$, $PC_2$ ... $PC_n$ are operated in synchronization with a system clock signal SC generated by an oscillator (OSC) 1 while input signals are fed to input terminals $IN_1$, $IN_2$ ... $IN_n$ of the respective processors $PC_1$, $PC_2$ ... $PC_n$ to output operation results to respective output terminals $OUT_1$, $OUT_2$ ... $OUT_n$ to be connected to various actuators.

In FIG. 2, there is shown one embodiment of a processor PC which detects a running speed of an automobile and outputs an error signal when the running speed falls less than a certain value. In FIG. 3, there are shown waves forms of signals appearing in FIG. 2.

In FIGS. 2 and 3, a gate time generator 2 outputs a pulse signal b every certain times of the system clock signal (SC) a input from the OSC 1 to the gate time generator 2, and the pulse signal b as a reset signal for a counter 3 and a latch signal for a data latch 4 is fed to a reset terminal of the counter 3 and a latch-in terminal of the data latch 4.

A speed signal (SV) c for an automobile is input to an input terminal IN of the counter 3 which counts the number of the speed signals c while two reset signals b are fed from the gate time generator 2 to the counter 3 to output a count number signal d to the data latch 4. The data latch 4 latches the count number signal d and outputs a data signal e to a comparator 5 every time when the latch signal b is fed from the gate time generator 2 to the comparator 5.

In the comparator 5, the data signal e representing a running speed of the automobile is compared with a reference signal representing a predetermined reference running speed, and, when running speed of the automobile is lower than the predetermined reference running speed, the comparator 5 outputs an error signal f to an output terminal OUT.

When the error signal f output by the comparator 5 is sent to an actuator such as a speed controller (not shown) for the automobile in order to control a revolution speed of an engine so as not to fall less than the predetermined running speed of the automobile.

In this case, when a problem or anything unusual such as an accident or something wrong in the system clock signal a, for example, the system clock signal is stopped due to an inferior soldering in the OSC 1 or the frequency of the system clock signal is raised by an accident, the normal operation can not be carried out in the processor, and the output condition thereof becomes unstable. Hence, a problem may be caused in the output stage depending on an object to be controlled.

In FIG. 3, for instance, the system clock signal a is normally generated before the time $t_1$, the frequency of the system clock signal a is raised between the times $t_1$ and $t_2$, and the system clock signal a is stopped after the time $t_2$.

When the frequency of the system clock signal a is raised like in the time $t_1$ to $t_2$, the interval of the reset signals b to be fed to the counter 3 is shortened, and the counted value γ represented by the count number signal d or the data signal e becomes less than the actual running speed of the automobile. Accordingly, the error signal f is output from the comparator 5, thereby erroneously increasing the running speed of the automobile.

Further, when the system clock signal a is stopped like after the time $t_2$, the value of the data signal e output by the data latch 4 is not changed, and thus the value of the data signal e output just before the stop of the system clock signal is continuously output regardless of the actual running speed of the automobile. Hence, in case that the system clock signal a is stopped when the error signal f is output from the comparator 5, the comparator 5 keeps to output the error signal f. As a result, the actuator connected to the output terminal OUT continues to increase the running speed, which may cause the increase of the running speed with no limitation.

In FIG. 4, there is shown another conventional digital circuit which comprises an asynchronous octal counter 11 composed of first, second and third D-type flip flops 12, 13 and 14 connected in series, a NOR circuit 15 for operating a NOR of the two most significant bits of the counter 11, a D-type flip flop 16 for removing a hazard and an inverter 17. In the digital circuit, the system clock signal a is fed to an input terminal IN, and an actuator 18 represented by a load 19 and a MOS transistor 20 is coupled to an output terminal OUT. In FIG. 5, there are shown waveforms of signals shown in FIG. 4.

In the asynchronous counter 11, the system clock signal a is input to the first flip flop 12 and the output signals of the first and second flip flops 12 and 13 are fed to the respective second and third flip flops 13 and 14. In the counter 11, as well-known, T second delay is caused every one flip flop, and hence one bit output signal b, c and d of the first, second and third flip flops 12, 13 and 14 are delayed in order from the least significant bit by T second, 2T second and 3T second, respectively, with respect to the system clock signal a. Hence, when the NOR of the two significant bits of the output signals c and d in the counter 11 is operated, a hazard Z is caused in an output signal e of the NOR circuit 15. That is, the output signals c and d of the second and third flip flops 13 and 14 simultaneously become the "L" level for T second of the delay time between the falling of the output signal c and the rising of the output signal d, and the output signal e of the NOR circuit 15 becomes the "H" level for this T second of the delay time. The caused hazard Z can cause an erroneous operation and thus should be removed.

In this case, the hazard Z is removed by using the D-type flip flop 16 connected to the NOR circuit 15. That is, since the hazard Z is shifted by 2T second from the system clock signal a, the D-type flip flop 16 can not read the hazard Z and hence outputs a normal signal containing no hazard Z. The normal output signal of the D-type flip flop 16 is inverted in the inverter 17 to obtain an inverted signal f to be sent to the output terminal OUT. The inverted signal f is applied as a drive signal for the actuator 18 coupled to the output terminal OUT.

In FIG. 6, there is shown still another digital circuit. In this case, an asynchronous octal counter 21 is composed of first, second and third D-type flip flops 22, 23 and 24 connected in series. A one-shot circuit 25 is composed of two D-type flip flops 26 and 27 and an AND circuit 28 connected thereto. Three XOR circuits 29, 30 and 31 operate XORs between three output signals b, c and d of the first, second and third D-type flip flops 22, 23 and 24 and three input signals e, f and i to output three signals f, h and j, respectively, and these three output signals f, h and j are fed to a NOR circuit 32 for operating a NOR of these three signals f, h and j. An RS flip flop 33 receives an output signal k of the NOR circuit 32 and outputs a signal to an inverter 34 which inverts the signal and outputs an inverted signal m to an output terminal OUT.

Now, assuming that the input signals e, g and i have the "H", "L" and "H" levels, respectively, when the levels of the output signals b, c and d of the D-type flip flops 22, 23 and 24 of the counter 21 are coincident with the levels of the input signals e, g and i, respectively, the output signals f, h and j of the respective XOR circuits 29, 30 and 31 become the "L" level. When the output signals f, h and j of the XOR circuits 29, 30 and 31 become the "L" level at the same time, the NOR circuit 32 outputs the signal k having the "H" level to be input as a reset signal to the RS flip flop 33. The one-shot circuit 25 receives the most significant bit of the counter 21 and outputs a one-shot signal l as a set signal to the RS flip flop 33 to determine the frequency of the output signal m of the inverter 34.

SUMMARY OF THE INVENTION

Accordingly, it is an object of the present invention to provide a digital circuit including a fail-safe circuit which is capable of forcibly and automatically holding an output of the digital circuit to a fail-safe side when a problem or anything unusual such as a stop or a frequency change of a system clock signal happens.

In accordance with one aspect of the present invention, there is provided a digital circuit, comprising a processor which is operated in synchronization with a clock signal and outputs a control signal to be fed to an actuator, converter means for converting a period or frequency of the clock signal to an analog voltage value, comparator means for comparing whether or not the analog voltage valve is within a reference value range to output a comparison signal, and holding means for allowing the control signal to pass or stop to the actuator on the basis of the comparison signal.

In accordance with another aspect of the present invention, there is provided a digital circuit, comprising ordering circuit means operated in synchronization with a first clock signal, shift register means connected to the ordering circuit means, the shift register means having at least two stages operated by second and third clock signals having respective periods to output an output signal, and having time constants larger than those of the periods of the second and third clock signals at the output sides of the two stages, and at least two of charge and discharge path means for holding the output signal of the shift register means to a fail-safe side, the two of the charge and discharge path means being connected to the output sides of the two stages of the shift register means.

DESCRIPTION OF THE PREFERRED EMBODIMENTS

Figure 8:
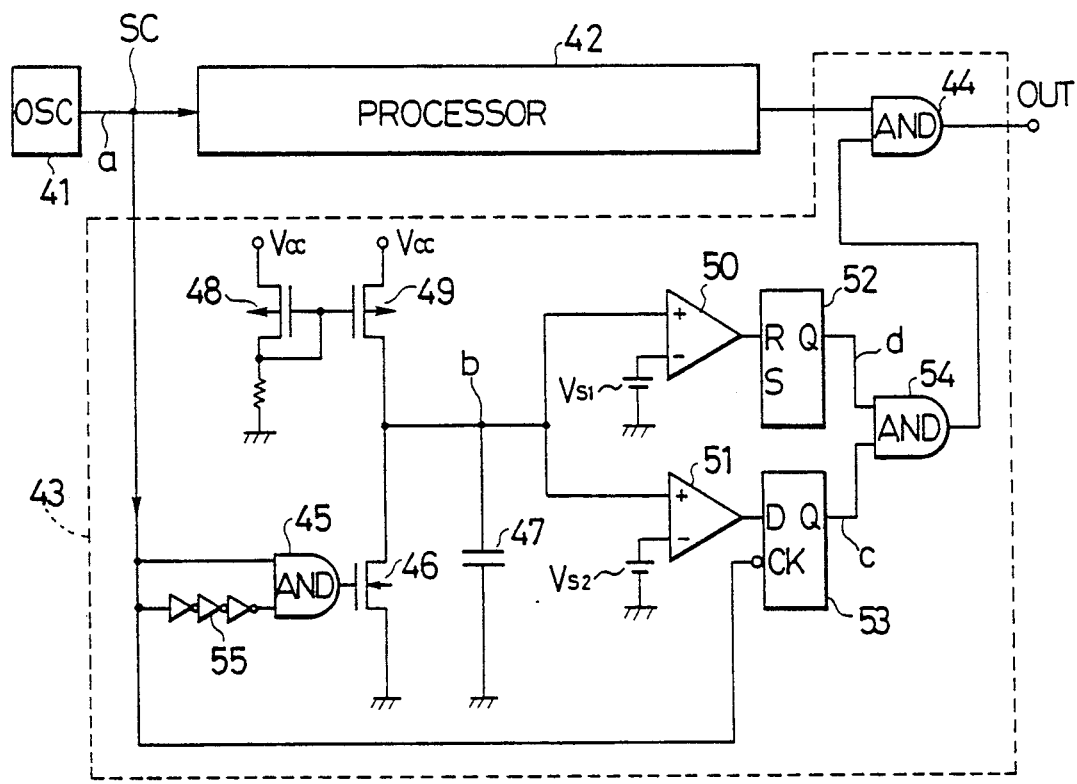
FIG. 8 is a circuit diagram of a first embodiment of a digital circuit according to the present invention.

Referring now to the drawings, wherein like reference characters designate like or corresponding parts throughout the several views and thus the repeated description thereof may be omitted for the brevity, there is shown in FIG. 8 the first embodiment of a digital circuit including a fail-safe circuit according to the present invention.

Figure 1:
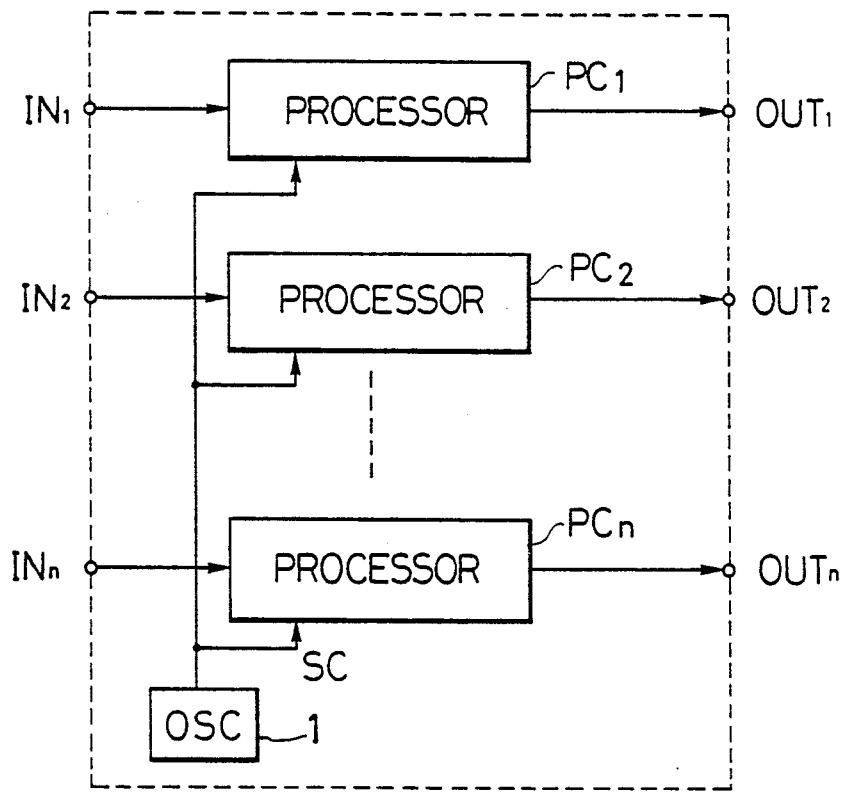
FIG. 1 is a block diagram of a conventional digital circuit.
Figure 2:
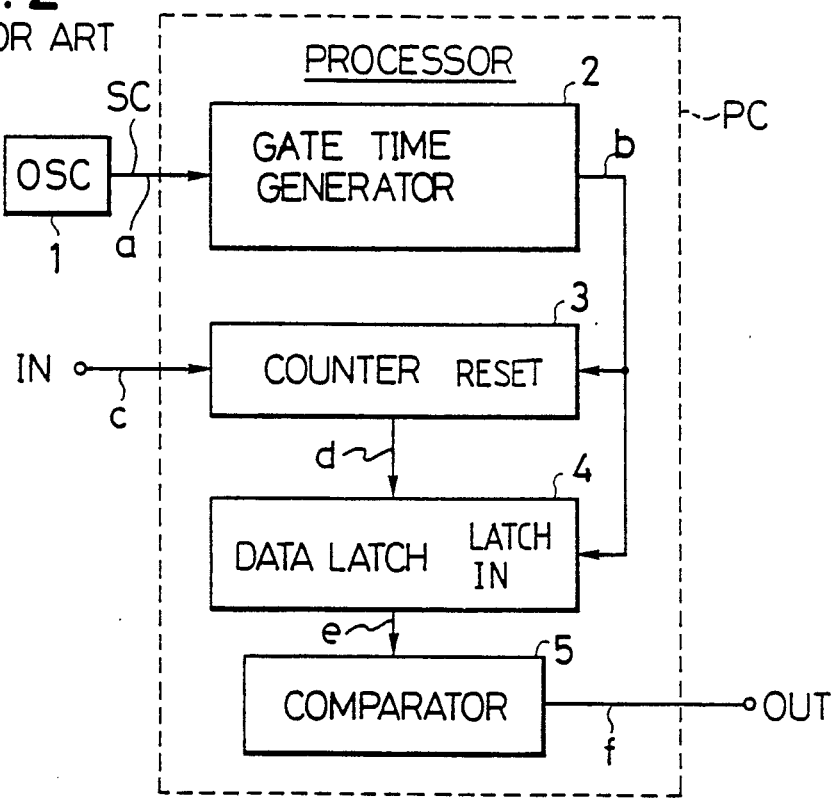
FIG. 2 is a block diagram of one embodiment of a processor shown in FIG. 1.
Figure 3:
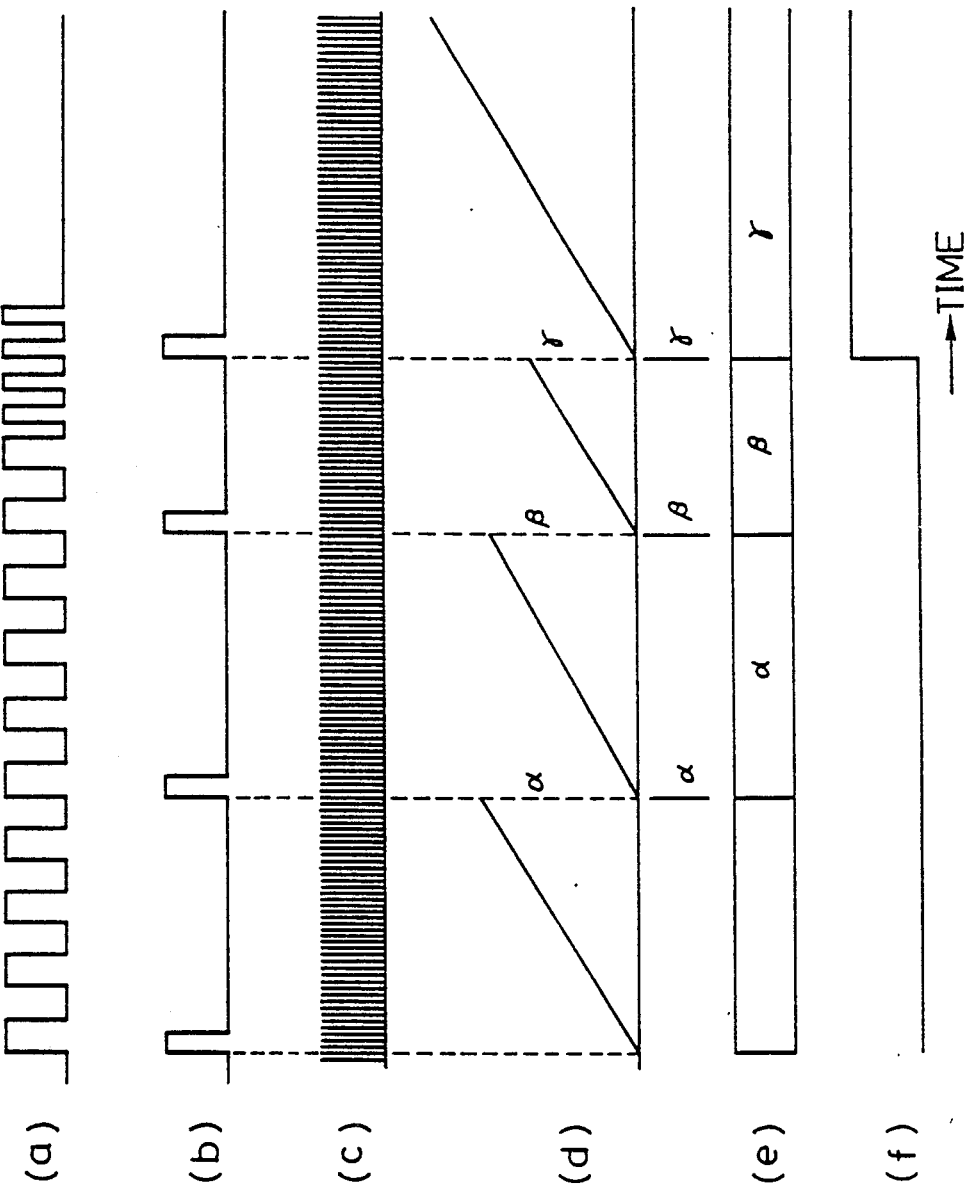
FIG. 3 is a timing chart of waveforms of signals appearing in FIG. 2.
Figure 4:
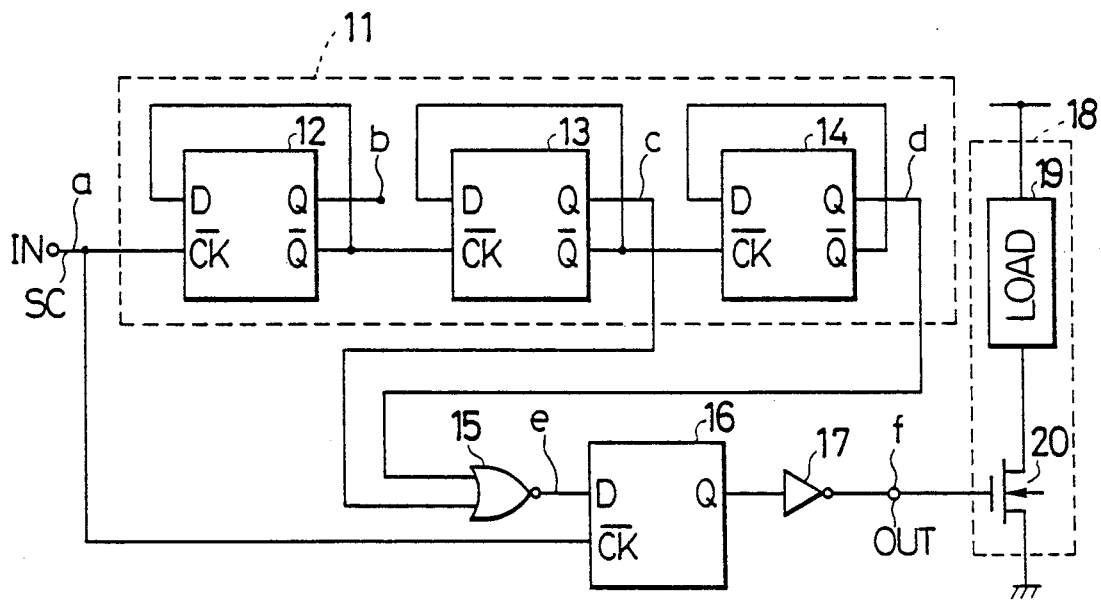
FIG. 4 is a circuit diagram of another conventional digital circuit.
Figure 5:
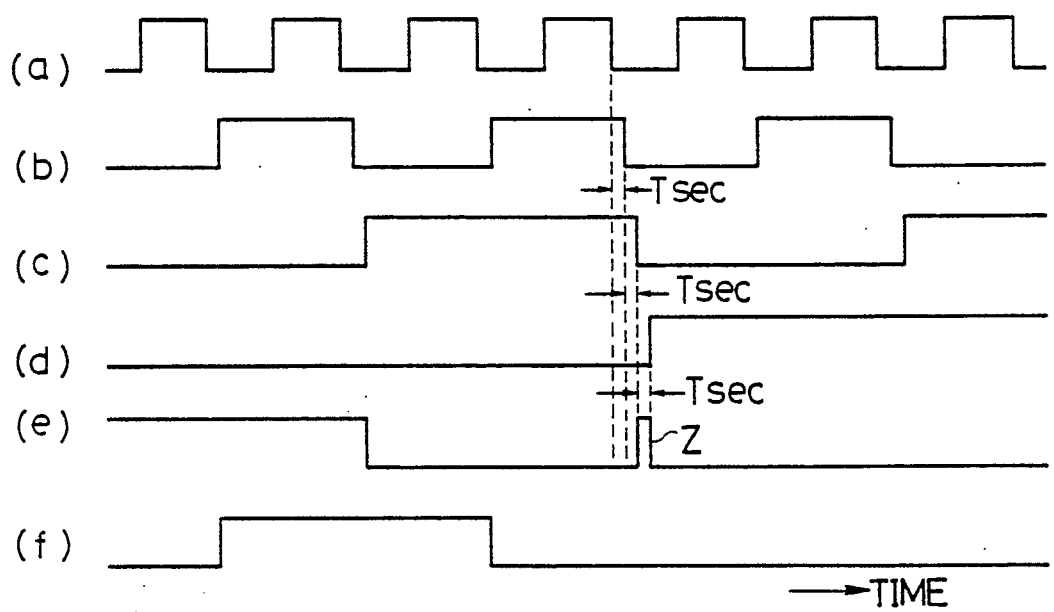
FIG. 5 is a timing chart of waveforms of signals shown in FIG. 4.
Figure 6:
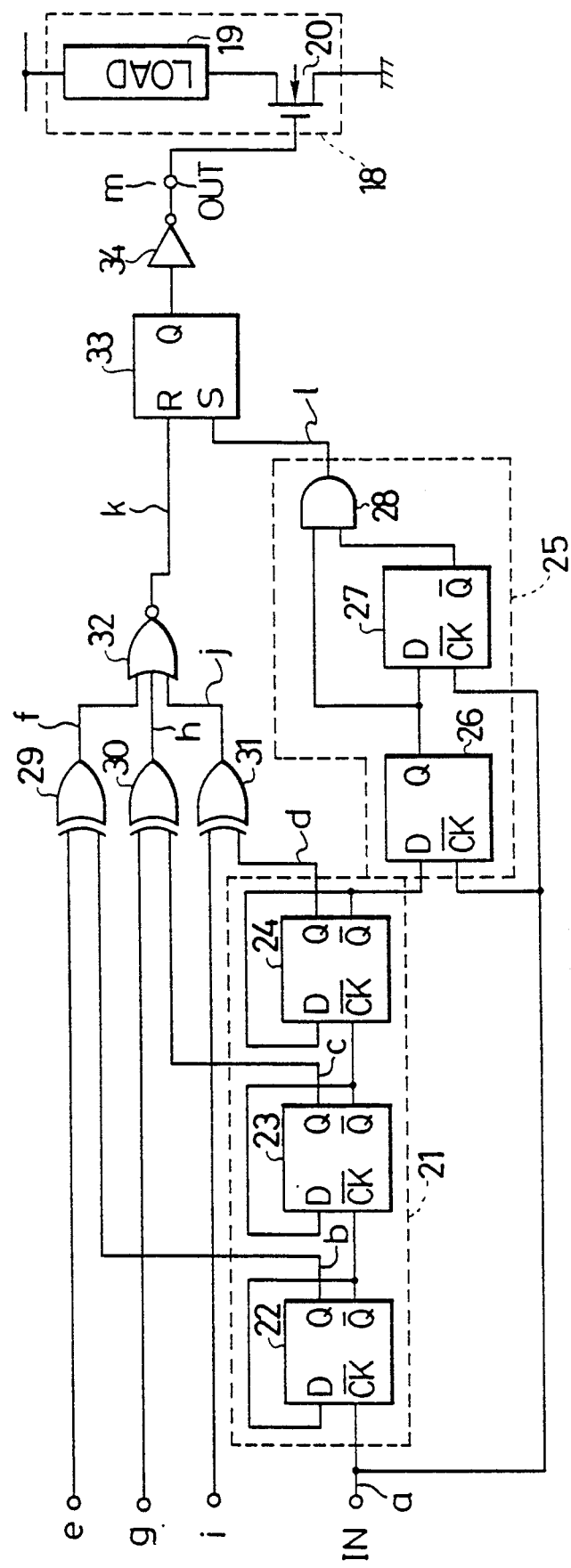
FIG. 6 is a circuit diagram of still another conventional digital circuit.
Figure 7:
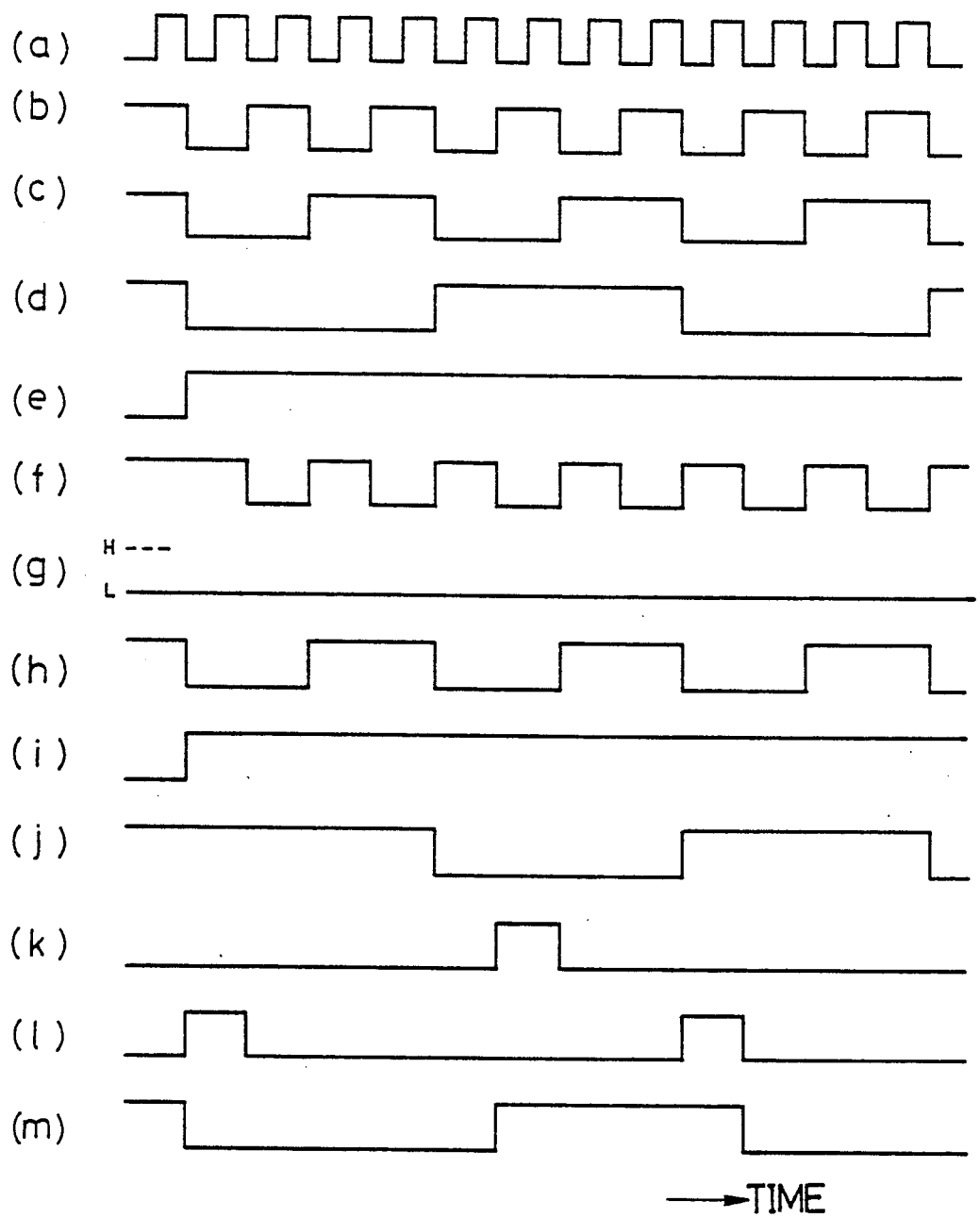
FIG. 7 is a timing chart of waveforms of signals shown in FIG. 6.
Figure 9:
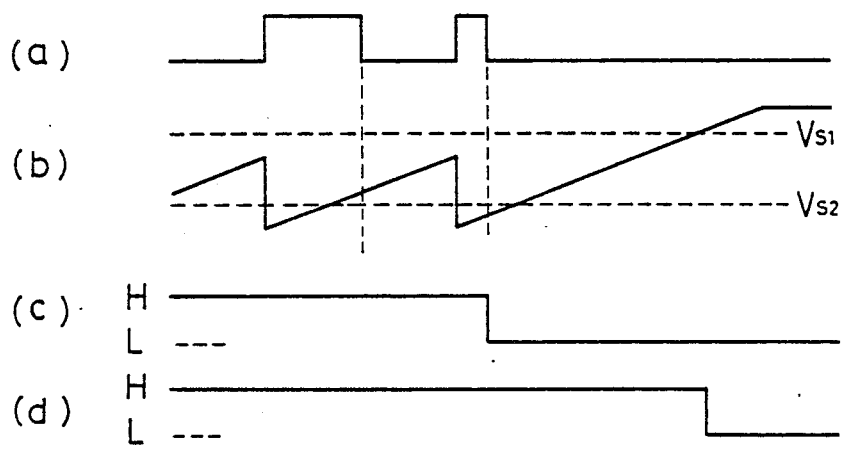
FIG. 9 is a timing chart of waveforms of signals shown in FIG. 8.

In FIG. 8, an oscillator 41 generates a system clock signal (SC) a to a processor 42 having a conventional structure, for example, the one shown in FIG. 2, and to a fail-safe circuit 43 for allowing an output signal of the processor 42 to pass or stop to an actuator to be coupled thereto. The fail-safe circuit 43 includes AND circuits 44, 45 and 54, transistors 46, 48 and 49, a capacitor 47, comparators 50 and 51 and flip flops 52 and 53, as hereinafter described in detail. In FIG. 9, there are shown waveforms of signals appearing in FIG. 8.

When one system clock signal (SC) a generated by the oscillator 41 is fed to the AND circuit 45, the output signal of the AND circuit 45 temporarily becomes the "H" level, and the transistor 46 is energized to be continuous to release the electric charge of the capacitor 47. Then, the transistor 46 is immediately deenergized to be discontinuous, and the capacitor 47 is gradually charged by constant current sources such as the transistors 48 and 49 and so forth. Then, next one system clock signal a is input to the AND circuit 45, the electric charge of the capacitor 47 is released again in the same manner as described above. This operation is repeated. Therefore, a voltage of a terminal signal b of the capacitor 47 corresponds to the period of the system clock signal a.

The voltage of the terminal signal b of the capacitor 47 is compared with high and low reference voltages $V_{S1}$ and $V_{S2}$ in respective comparators 50 and 51. When the voltage of the terminal signal b is higher than the low reference voltage $V_{S2}$, the output signal of the comparator 51 becomes the "H" level and is read in the D-type flip flop 53 by the trailing edge of the system clock signal a.

When the frequency of the system clock signal a is higher than the predetermined reference value or the period of the system clock signal a is reduced, the D-type flip flop 53 carries out the read-in of the signal output by the comparator 51 prior to the voltage of the terminal signal b becomes more than the low reference voltage $V_{S2}$, and thus an output signal c of the D-type flip flop 53 becomes the "L" level.

Meanwhile, when the frequency of the system clock signal a is lowered as compared with a certain value, e.g., the system clock signal a is stopped, the voltage of the terminal signal b becomes higher than the high reference voltage $V_{S1}$ in the comparator 50, and an output signal d of the flip flop 52 becomes the "L" level.

Consequently, an output signal of the AND circuit 54 becomes the "H" level only when the frequency of the system clock signal a is within the predetermined range. That is, when the frequency of the system clock signal a is more or less than the predetermined range, the output signal of the AND circuit 54 becomes the "L" level.

The output signals of the processor 42 and the AND circuit 54 are provided to the AND circuit 44 which functions as a gate for allowing the output signal of the processor 42 to pass or stop to the output terminal OUT. Hence, when the frequency of the system clock signal a is deviated from the predetermined range, the output signal of the AND circuit 44 is always forcibly held to the "L" level without regard to the output signal of the processor 42. Hence, by so determining a characteristic of an object to be controlled by an actuator coupled to the output terminal OUT of the fail-safe circuit 43 that the "L" level at the output terminal OUT is the fail-safe side, when a problem or anything unusual such as a stop or a frequency change in the system clock signal happens, the output of the digital circuit can be exactly held to the safe side.

In this embodiment, although it is difficult to measure the exact frequency of the system clock signal in the digital circuit, the accuracy is sufficient for observing in a range, and the stable operation can be achieved in a frequency of more than several tens of MHz.

Figure 10:
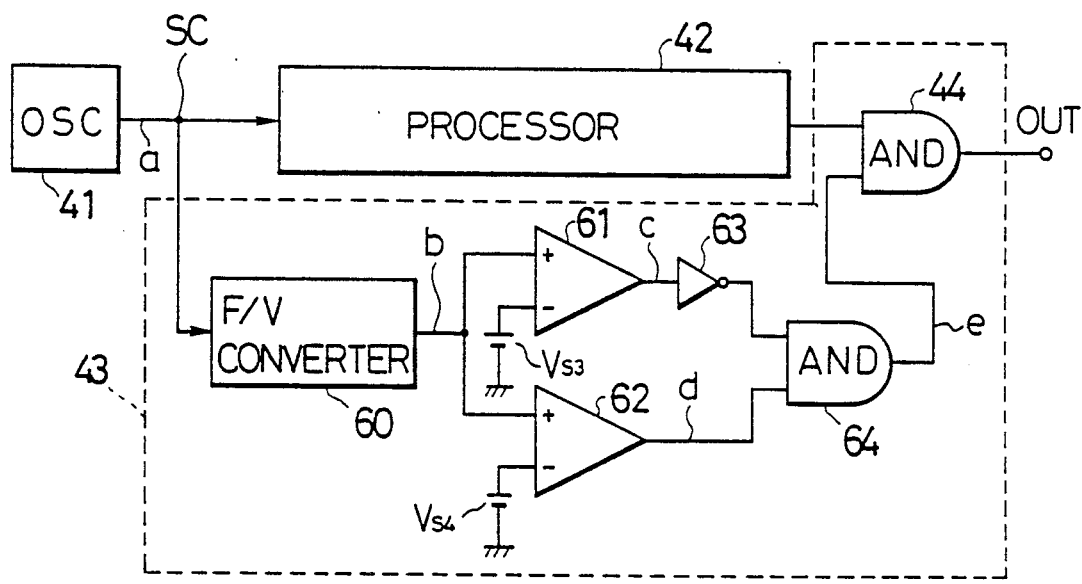
FIG. 10 is a circuit diagram of a second embodiment of a digital circuit according to the present invention.
Figure 11:
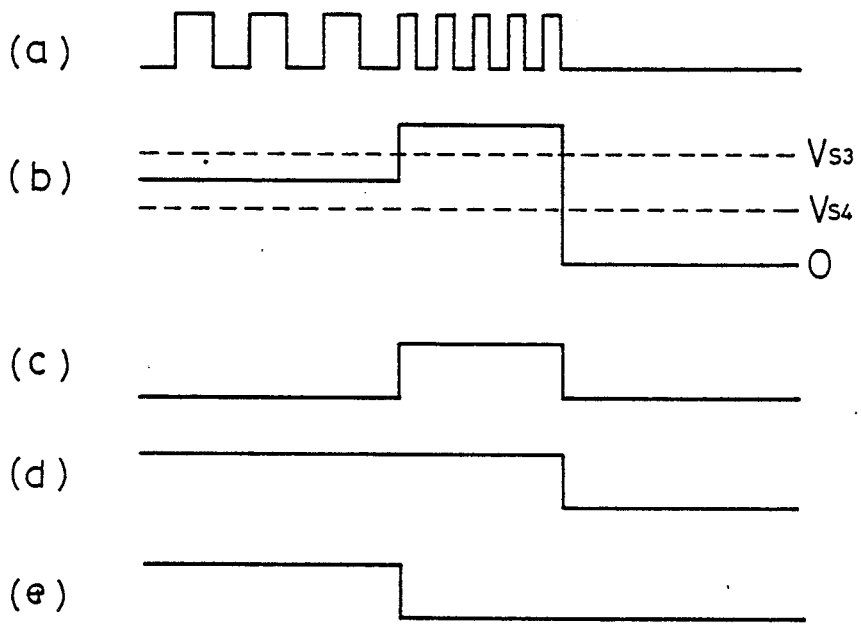
FIG. 11 is a timing chart of waveforms of signals shown in FIG. 10.

In FIG. 10, there is shown the second embodiment of a digital circuit including a fail-safe circuit according to the present invention having the same structure as the first embodiment shown in FIG. 8, except the fail-safe circuit 43. The fail-safe circuit 43 includes AND circuits 44 and 64, a frequency-voltage (F/V) converter 60, comparators 61 and 62 and an inverter 63. FIG. 11 illustrates waveforms of signals shown in FIG. 10.

Now, when a system clock signal a is fed to the F/V converter 60, the F/V converter 60 outputs a signal b having a voltage corresponding to the frequency of the system clock signal a to the comparators 61 and 62. In the comparators 61 and 62, the voltage of the output signal b of the F/V converter 60 is compared with high and low reference voltages $V_{S3}$ and $V_{S4}$.

When the frequency of the system clock signal a is within the predetermined range, the voltage of the output signal b of the F/V converter 60 is between the high and low reference voltages $V_{S3}$ and $V_{S4}$. Hence an output signal c of the comparator 61 becomes the "L" level, and the inverter receives the output signal c of the comparator 61 and outputs an output signal having the "H" level. At the same time, an output signal d of the comparator 62 becomes the "H" level. Hence, an output signal e of the AND circuit 64 becomes the "H" level.

When the frequency of the system clock signal a is higher than the reference value range, the voltage of the output signal b of the F/V converter 60 is higher than the high reference voltage $V_{S3}$, and the output signal c of the comparator 61 is the "H" level. Accordingly, the output signal of the inverter 63 is the "L" level, and the output signal e of the AND circuit 64 is the "L" level.

Further, when the frequency of the system clock signal a is lower than the reference value range or the system clock signal is stopped, the voltage of output signal b of the F/V converter 60 is lower than the low reference voltage $V_{S4}$, and the output signal d of the comparator 62 is the "L" level. Hence, the output signal e of the AND circuit 64 is the "L" level.

The output signals of the processor 42 and the AND circuit 64 are provided to the AND circuit 44. Hence, when the frequency of the system clock signal a is deviated from the predetermined range, the output signal of the AND circuit 44 is always forcibly held to the fail-safe side in the same manner as the first embodiment described above, with the result of the same effects and advantages as those of the first embodiment.

In the embodiments, as described above, the period or frequency of the system clock signal is converted into an analog voltage value, and the deviation of this analog voltage value from the predetermined range is discriminated as a problem to forcibly and automatically hold the output signal of the fail-safe circuit to the fail-safe side, thereby preventing an object to be controlled by an actuator coupled to the output terminal of the fail-safe circuit from an accident by the abnormal operation and safely controlling the same.

Figure 12:
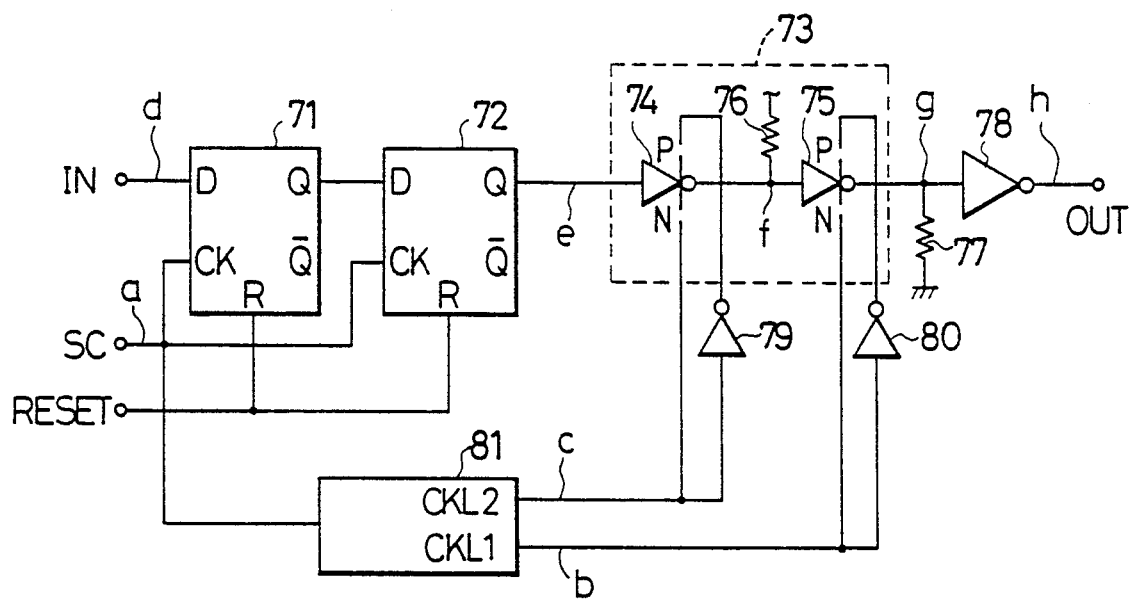
FIG. 12 is a circuit diagram of a third embodiment of a digital circuit according to the present invention.
Figure 13:
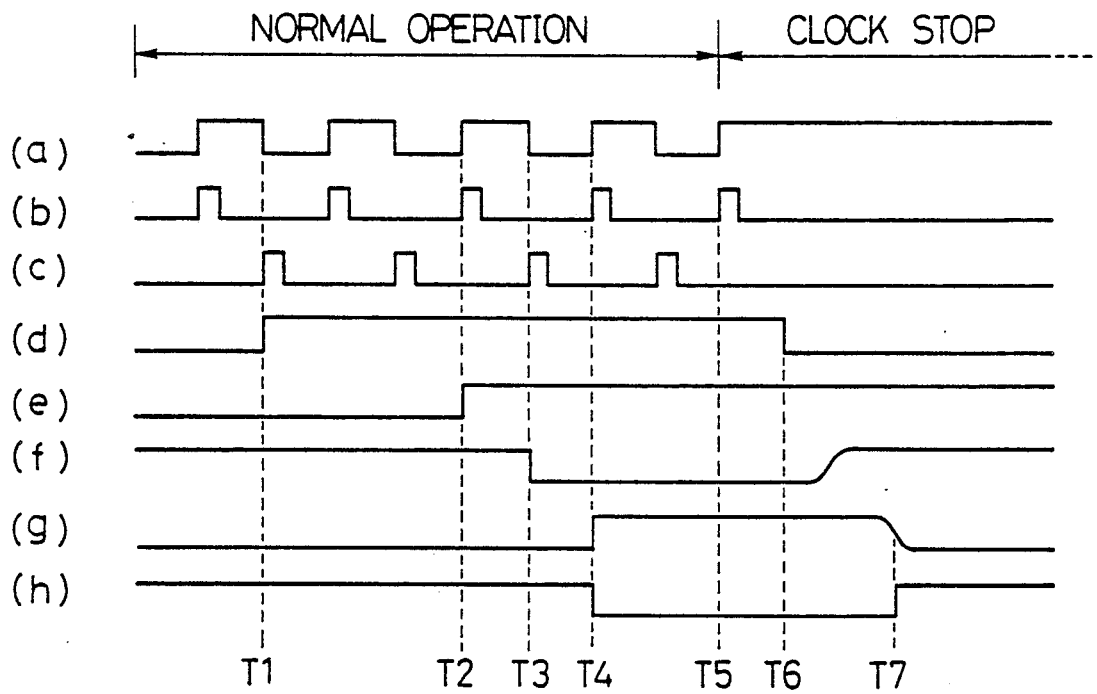
FIGS. 13 and 14 are timing charts of waveforms of signals shown in FIG. 12.

In FIG. 12, there is shown the third embodiment of a digital circuit including a fail-safe circuit according to the present invention. FIG. 13 illustrates waveforms of signals shown in FIG. 12.

As shown in FIG. 12, first and second D-type flip flops 71 and 72 connected in series shift an input signal d fed to an input terminal IN connected to the first D-type flip flop 71. The first and second D-type flip flops 71 and 72 constitute an ordering circuit. A system clock signal (SC) a is fed to the first and second D-type flip flops 71 and 72 and to a two-layer clock generator 81 which generates two one-shot pulses b and c from its CKL1 and CKL2 terminals in synchronization with the leading and trailing edges of the system clock signal a. A reset signal is sent to the first and second D-type flip flops 71 and 72 for resetting the same.

A dynamic D-type flip flop 73 comprises first and second clocked inverters 74 and 75. The first clocked inverter 74 acts as an inverter when the one-shot pulse c of the clock generator 81 is the "H" level, and an inverter 79 drives the first clocked inverter 74. The second clocked inverter 75 acts as an inverter when the one-shot pulse b of the clock generator 81 is the "H" level, and an inverter 80 drives the clocked inverter 75. An output signal e of the second D-type flip flop 72 is input to the first clocked inverter 74, and the first clocked inverter 74 outputs a signal f to the second clocked inverter 75. The second clocked inverter outputs a signal g to an output inverter 78. Two high resistance resistors 76 and 77 are connected between the first and second clocked inverters 74 and 75 and between the second clocked inverter 75 and the inverter 78, respectively. The inverter 78 outputs a signal h to an output terminal OUT to be coupled to an actuator (not shown).

The operation of the digital circuit shown in FIG. 12 will be described in connection with FIG. 13. In this case, the level "1" at the output terminal OUT represents the fail-safe side.

In the normal operation up to the time T5, the input signal d changes from "0" level to "1" level at the time T1 and is shifted by the first and second D-type flip flops 71 and 72 in synchronization with the leading edge of the system clock signal a. The output signal e of the second D-type flip flop 72 becomes "1" at the time T2.

In the dynamic D-type flip flop 73, at the time T3 the first clocked inverter 74 reads in "1" level of the output signal e of the second D-type flip flop 72 and outputs "0" level of the signal f to the second clocked inverter 75. At the time T4 the one-shot pulse b of the clock generator 81 changes from "0" to "1" and the clocked inverter 75 reads in "0" level of the output signal f of the first clocked inverter 74 and outputs "1" level of the signal g to the inverter 78 which outputs "0" level of the signal h to the output terminal OUT at the same timing. As described above, the dynamic D-type flip flop 73 functions as a shift register having a delay constant of 3 to 4 times of the system clock signal a.

In the case that the system clock signal a is stopped by any cause at the oscillator and is fixed to "1" level at the time T5, even when the input signal d changes from "1" level to "0" level at the time T6, since there is no leading edge of the system clock signal a, the previous output level state is fixed as shown by the output signal e of the second D-type flip flop 72 in a conventional circuit. However, in this embodiment, since the one-shot pulses b and c of the clock generator 81 are also stopped, the floating states are fixed at the points f and g, and the inputs of the second clocked inverter 75 and the inverter 78 are held by only the gate capacities thereof.

That is, as shown in FIGS. 12 and 13, when the one-shot pulses b and c of the clock generator 81 are stopped at the time T5, the clocked inverters 74 and 75 stop their inversion operation, and the output signals f and g of the first and second clocked inverters 74 and 75 are fixed to "1" and "0" levels respectively. Then, at the point f the "L" level of the output signal f is charged by the resistor 76 to change to the "H" level, and at the point g the "H" level of the output signal g is discharged by the resistor 77 to change to the "L" level. At this time, the time constant (larger than the periods off the one-shot pulses b and c) can be determined depending on the gate capacities of the clocked inverters 74 and 75 and the resistances of the resistors 76 and 77. In this case, when the level of the output signal g of the second clocked inverter 75 falls down to less than a threshold value of the output inverter 78 at the time T7, the output signal h at the output terminal OUT becomes "1" level which is held thereafter. Therefore, the output of the circuit where the input signal d is "0" level, is held to the fail-safe side. Therefore, an output signal of a processor (not shown) is controlled to be passed or stopped to or from an actuator coupled thereto by using the output signal h of the output terminal OUT in the same manner as the first embodiment described above.

Figure 14:
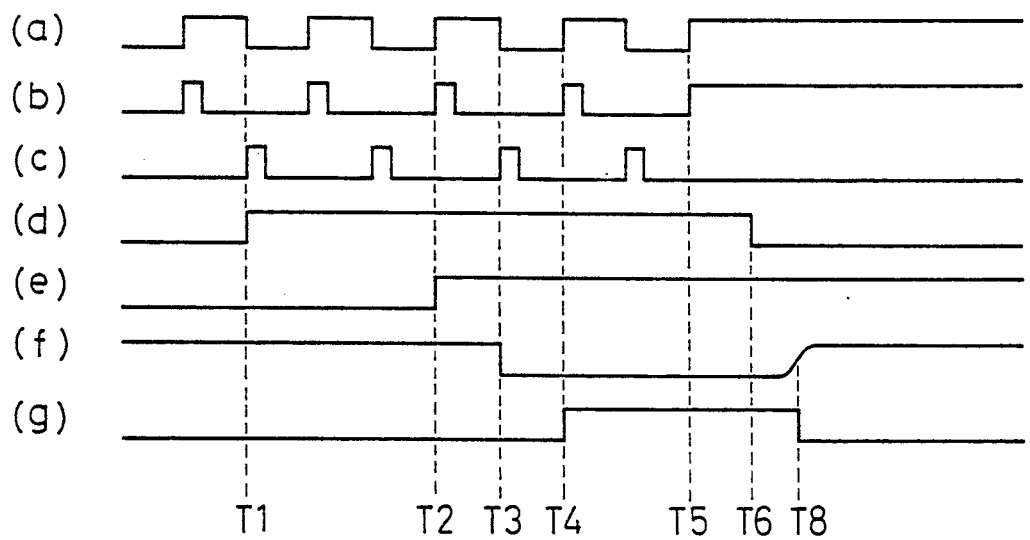

Further, as shown in FIG. 14, when the one-shot pulse b of the clock generator 81 is fixed to the same "1" level as that of the system clock signal a, the first clocked inverter 74 is in the open state, and the electric charge at the point f is held by only the gate capacity of the second clocked inverter 75. Hence, even when the second clocked inverter 75 acts as the inverter, the level at the point f increases. When the level at the point f increases beyond a threshold value of the second clocked inverter 75 at the time T8, the output signal g of the second clocked inverter 75 becomes "0" to hold the level at the output terminal OUT to "1", thereby holding the output signal to the fail-safe side.

In the third embodiment of a digital circuit shown in FIG. 12, two high resistance resistors 76 and 77 for holding the output to the fail-safe side are required to be connected to the points f and g which become open state when the system clock signal is stopped, and thus the electric charge may be missing in the open state of the normal operation. Therefore, for instance, when the gate capacity is determined to approximately 0.1 pF and the resistance values of the resistors 76 and 77 are determined to approximately 10 MΩ, the clock frequency is required to be determined to more than 1 MHz. Accordingly, in order to design a circuit of a low clock frequency in the structure shown in FIG. 12, it is necessary to increase the resistance value of the resistors. In such a case using such high resistance resistors, when a circuit is fabricated in the form of an integrated circuit, the chip area increased.

Figure 15:
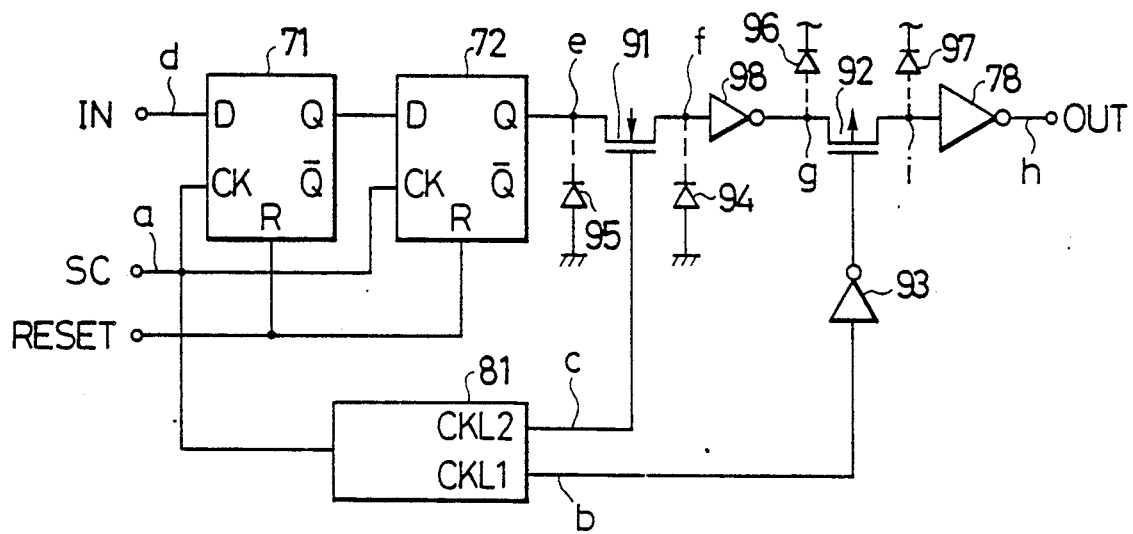
FIG. 15 is a circuit diagram of a fourth embodiment of a digital circuit according to the present invention.

In FIG. 15, there is shown the fourth embodiment of a digital circuit including a fail-safe circuit according to the present invention, having a similar structure to that of the third embodiment shown in FIG. 12, except that an N-channel MOS (NMOS) 91 and a P-channel MOS (PMOS) 92 are provided instead of the first and second clocked inverters 74 and 75 of the third embodiment, which can solve the disadvantages of the third embodiment. In this embodiment, the level "0" at the output terminal OUT represents the fail-safe side.

Figure 16A:
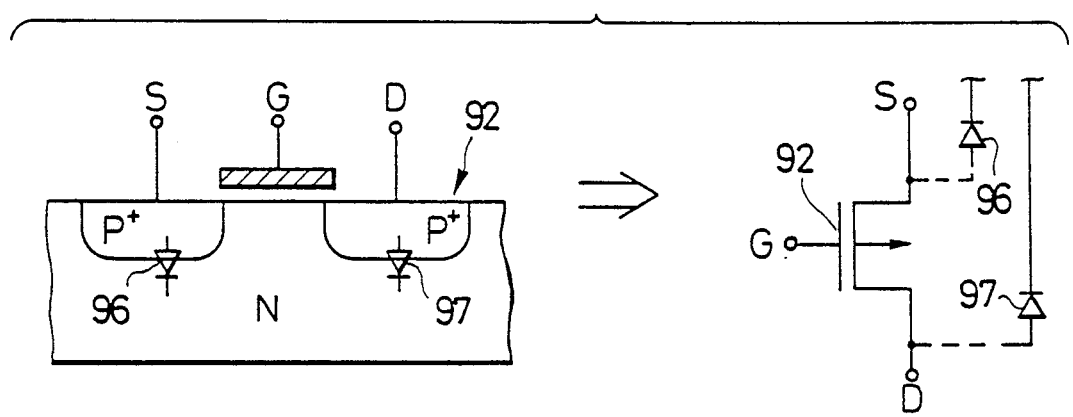
FIGS. 16a and 16b are schematic longitudinal cross sections illustrating parasitic diodes of transistors shown in FIG. 15 along with their equivalent circuits.
Figure 16B:
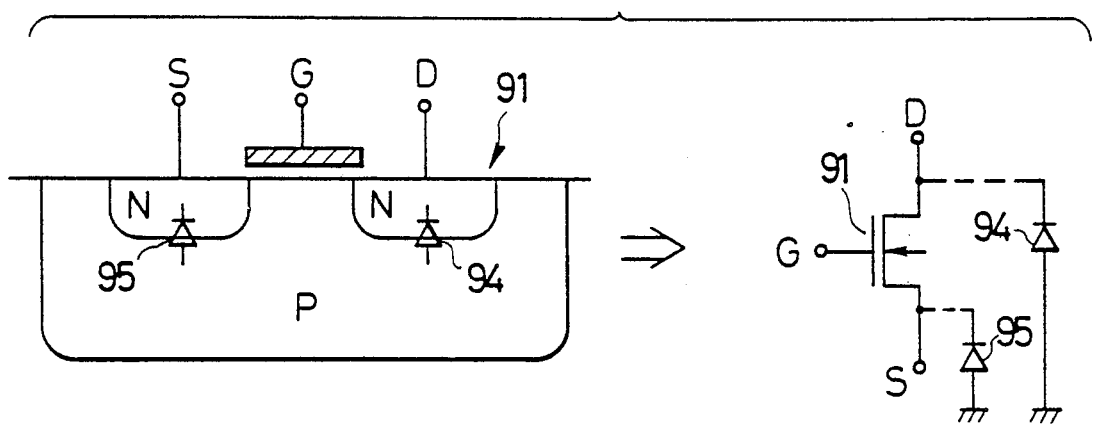

In this embodiment, when the one-shot pulse c of the clock generator 81 is "1" level, the one-shot pulse c is fed to the gate electrode of the NMOS 91, and the NMOS 91 becomes on-line to pass the output signal e of the second D-type flip flop 72 to an inverter 98. Then, when the one-shot pulse b of the clock generator 81 is "1" level, an inverter 93 inputting the one-shot pulse b outputs an inverted signal to the gate electrode of the MOS PMOS 92, and the PMOS 92 becomes on-line to pass an output signal g of the inverter 98 to an output inverter 78 to carry out a shift action. In this case, diodes 94, 95, 97 and 96 are parasitic diodes formed in the drain and source regions of the NMOS 91 and the PMOS 92, as shown in FIGS. 16b and 16a, and the diodes 94 and 97 act as discharge and charge paths, respectively.

When the system clock signal a is stopped by any cause at the oscillator and the one-shot pulses b and c of the clock generator 81 are fixed to "0" level, the output signals f and i of the respective NMOS 91 and PMOS 92 are held to "0" and "1" levels by the parasitic diodes 94 and 97 thereof, thereby holding the output signal h at the output terminal OUT to "0" level or the fail-safe side.

In this embodiment, the leakage current of the NMOS 91 and PMOS 92 is approximately several tens of nA, and thus they can be used in a circuit of a low frequency of approximately several hundreds of kHz. When they are used in a further low frequency, the gate capacity can be increased by adding a capacitor.

In the preferred embodiments, a shift register including a charge or discharge path for holding the output to the fail-safe side is provided in an output of an ordering circuit where the output is fixed in the previous state by the stop of the system clock signal. In such a case, by determining a time constant of a charge or discharge path to a larger value than a period of a system clock signal for driving a shift register, a circuit acts as an ordering circuit when the system clock signal is normal and also acts to hold the output to the fail-safe side after a short time determined by the time constant. Hence, the logical designing can be carried out in the normal static operation, and the output signal can be forcibly held to the fail-safe side when the system clock signal is stopped, without requiring any particular clock detection circuit or the like.

What is claimed is:

1. A digital circuit, comprising:
   a processor which is operated in synchronization with a clock signal and outputs a control signal to be fed to an actuator;
   converter means for converting a period or frequency of the clock signal to an analog voltage value;
   comparator means for comparing whether or not the analog voltage value is within a reference value range to output a comparison signal; and
   gate means, connected to the processor and the comparator means, for outputting either the control signal or a fail-safe signal for holding the control signal of the processor to a predetermined fail-safe side to the actuator on the basis of the comparison signal.

2. The circuit of claim 1, wherein the converter means includes an AND circuit, a transistor device connected to the AND circuit, a capacitor connected to the transistor device and a current source device for supplying a constant current to the capacitor.

3. The circuit of claim 2, wherein the current source includes a transistor device.

4. The circuit of claim 1, wherein the comparator means includes first and second comparator devices for comparing the analog voltage value with high and low reference values, respectively.

5. The circuit of claim 4, wherein each of the first and second comparator devices includes a comparator and a flip flop connected thereto.

6. The circuit of claim 1, wherein the gate means includes AND circuits.

7. A digital circuit, comprising:
   ordering circuit means operated in synchronization with a first clock signal;
   shift register means connected to the ordering circuit means, the shift register means having at least two stages operated by second and third clock signals having respective periods to output an output signal, and having time constants larger than those of the periods of the second and third clock signals at the output sides of the two stages; and
   at least two of charge and discharge path means for holding the output signal of the shift register means to a fail-safe side, the two of the charge and discharge path means being connected to the output sides of the two stages of the shift register means.

8. The circuit of claim 7, also including:
   a processor which is operated in synchronization with the first clock signal and outputs a control signal to be fed to an actuator; and
   means for allowing the control signal of the processor to pass or stop to the actuator on the basis of the output signal of the shift register means.

9. The circuit of claim 7, also including a clock generator operated in synchronization with the first clock signal to generate the second and third clock signals.

10. The circuit of claim 7, wherein the shift register means includes two clocked inverters connected to each other in series.

11. The circuit of claim 7, wherein the shift register means includes two MOS devices connected to each other in series.

12. The circuit of claim 7, wherein the ordering circuit means includes two flip flops connected to each other in series.

13. The circuit of claim 7, wherein the two of charge and discharge path means includes resistors.

14. The circuit of claim 11, wherein the two of charge and discharge path means includes parasitic diodes of the MOS devices.

15. The circuit of claim 1, wherein the converter means comprises a frequency-voltage converter for outputting a signal having a voltage corresponding to the frequency of the clock signal.

16. The circuit of claim 4, wherein one of the first and second comparator devices includes a comparator and an inverter connected thereto in series, and another of the first and second comparator devices includes another comparator.

17. A digital circuit, comprising:
   a processor which is operated in synchronization with a clock signal and outputs a control signal to be fed to an actuator;
   converter means for converting a period or frequency of the clock signal to an analog voltage value;
   comparator means for comparing whether or not the analog voltage value is within a reference value range to output a comparison signal; and
   holding means for allowing the control signal to pass or stop to the actuator on the basis of the comparison signal;
   wherein the converter means includes an AND circuit, a transistor device connected to the AND circuit, a capacitor connected to the transistor device and a current source device for supplying a constant current to the capacitor.

18. The circuit of claim 17, wherein the current source includes a transistor device.

19. A digital circuit, comprising:
   a processor which is operated in synchronization with a clock signal and outputs a control signal to be fed to an actuator;
   converter means for converting a period or frequency of the clock signal to an analog voltage value;
   comparator means for comparing whether or not the analog voltage value is within a reference value range to output a comparison signal; and
   holding means for allowing the control signal to pass or stop to the actuator on the basis of the comparison signal;
   wherein the comparator means includes first and second comparator devices for comparing the analog voltage value with high and low reference values, respectively; and
   wherein each of the first and second comparator devices includes a comparator and a flip flop connected thereto.

20. A digital circuit, comprising:

a processor which is operated in synchronization with a clock signal and outputs a control signal to be fed to an actuator;

converter means for converting a period or frequency of the clock signal to an analog voltage value;

comparator means for comparing whether or not the analog voltage value is within a reference value range to output a comparison signal; and holding means for allowing the control signal to pass or stop to the actuator on the basis of the comparison signal;

wherein the holding means includes AND circuits.

* * * * *